United States Patent [19]
Arimoto

[11] Patent Number: 5,166,945
[45] Date of Patent: Nov. 24, 1992

[54] VISIBLE LIGHT SURFACE EMITTING LASER DEVICE

[75] Inventor: Satoshi Arimoto, Itami, Japan

[73] Assignee: Mitsubishi Denki Kabushiki Kaisha, Tokyo, Japan

[21] Appl. No.: 779,815

[22] Filed: Oct. 21, 1991

[30] Foreign Application Priority Data

Nov. 28, 1990 [JP] Japan .................. 2-335831

[51] Int. Cl.$^5$ .............................. H01S 3/19
[52] U.S. Cl. .................................. 372/46
[58] Field of Search .............. 372/45, 46, 92, 108

[56] References Cited

U.S. PATENT DOCUMENTS

| | | | |
|---|---|---|---|
| 4,797,890 | 1/1989 | Inaba et al. | 372/46 |
| 5,034,954 | 7/1991 | Seiwa | 372/45 |
| 5,047,366 | 9/1991 | Murakami | 372/45 |

FOREIGN PATENT DOCUMENTS

| | | |
|---|---|---|
| 2592227 | 6/1987 | France . |
| 58-223394 | 12/1983 | Japan . |
| 62-086883 | 4/1987 | Japan . |
| 63-76390 | 4/1988 | Japan . |
| 63-104493 | 5/1988 | Japan . |
| 1108789 | 4/1989 | Japan . |
| 2040552 | 8/1980 | United Kingdom . |
| 2186425 | 8/1987 | United Kingdom . |

OTHER PUBLICATIONS

Gourley et al., "Visible, Room-Temperature, Surface-Emitting Laser Using an Epitaxial Fabry-Perot Resonator With AlGaAs/AsAs Quarter-Wave High Reflectors and AlGaAs/GaAs Multiple Quantum Wells", Applied Physics Letters, vol. 50, No. 18, May 1987, pp. 1225-1227.

Iga et al., "Room Temperature Pulsed Oscillation of GaAlAs/GaAs Surface Emitting Junction Laser Grown by MBE", Japanese Journal of Applied Physics, vol. 25, No. 6, Jun. 1986, pp. 924-925.

*Primary Examiner*—James W. Davie
*Attorney, Agent, or Firm*—Leydig, Voit & Mayer

[57] ABSTRACT

A surface emitting laser device for producing visible light includes a GaAs substrate having a (100) oriented main surface; a double heterojunction structure disposed on the main surface and including a first conductivity type AlGaInP first cladding layer, an undoped GaInP active layer epitaxially grown on the first cladding layer under such conditions that a natural superlattice is formed, and an AlGaInP second cladding layer formed on the active layer and having a second conductivity type opposite the first conductivity type; a groove penetrating the substrate; and a first conductivity type region formed by diffusing dopant impurities in the substrate and the second cladding layer other than opposite the groove and not reaching the first cladding layer, the natural superlattice being disordered in the region. Therefore, a current confinement structure and a light confinement structure are realized in the active layer. As a result, a surface emitting laser device producing visible light that oscillates at a low threshold current with controlled transverse mode oscillations is realized.

15 Claims, 7 Drawing Sheets

VISIBLE LIGHT SURFACE EMITTING LASER DEVICE

FIELD OF THE INVENTION

The present invention relates to a surface emitting laser device using AlGaInP system material and producing visible light.

BACKGROUND OF THE INVENTION

FIG. 7 is a cross-sectional view showing a surface emitting laser disclosed in "Room Temperature Pulsed Oscillation of GaAlAs/GaAs Surface Emitting Junction Laser Grown by MBE" by K. Iga, T. Nishimura, K. Yagi, T. Yamaguchi, and T. Niina, Japanese Journal of Applied Physics, Vol.25 (1986), pp.924–925.

In FIG. 7, reference numeral 30 designates a (100) oriented n type GaAs substrate. An n type GaAs layer 31 is disposed on a main surface of the substrate 30. An n type $Al_{0.3}Ga_{0.7}As$ cladding layer 32 is disposed beneath the n type GaAs layer 31. A p type GaAs active layer 33 is disposed beneath the n type cladding layer 32. A p type $Al_{0.3}Ga_{0.7}As$ cladding layer 34 is disposed beneath the active layer 33. A groove 43 of generally circular cross-section penetrates the substrate 30 and the n type GaAs layer 31. The p type cladding layer 34 has a circular mesa projection at a region opposite to the mesa groove 43. A p type $Al_{0.1}Ga_{0.9}As$ layer 42 is disposed beneath the circular mesa projection of the p type cladding layer 34. A $SiO_2$ film 35 is disposed beneath the p type cladding layer 34 covering the side surface and the circumference of the top surface of the circular mesa projection. A circular $SiO_2$ high reflectivity film 36 is disposed at the center of the top surface of the circular mesa projection. A Au/Zn/Au electrode 45 covers the lowest part of the laser device and is connected to the ring-shaped surface 41 of the p type $Al_{0.1}Ga_{0.9}As$ layer 42. A $SiO_2$ film 37 is disposed on the other main surface of the substrate 30. A Au/Sn electrode 38 is disposed on the $SiO_2$ film 37 and on the side surface of the groove 43. A Au mirror 44 is disposed on the bottom of the groove 43. An active region 39 is formed in a region in the active layer 33 just under the groove 43. Laser light 40 is emitted from the bottom of the groove 43 on which the Au mirror is disposed.

The operating principle of this surface emitting laser will be described. Electrons and holes supplied from the electrodes 38 and 45 are injected into the active layer 33. These electrons and holes are efficiently confined in the active layer 33 by the cladding layers 32 and 34 and combine to generate light having a wave-length equivalent to the energy band gap of the active layer 33. The generated light increases with an increase in the current level and is reflected and amplified between the Au mirror 44 on the bottom of the groove 43 and the circular $SiO_2$ film 36 on the top surface of the circular mesa projection. When the current exceeds a certain value (threshold current), the gain exceeds the loss, generating a laser oscillation. Thus, the laser light 40 is emitted from the bottom of the groove 43.

In a case where the prior art surface emitting laser is formed using AlGaInP system materials, of course the surface emitting laser structure can be realized, but the current confinement in the active layer is not sufficient in the prior art structure. In addition, since the AlGaInP system materials have a higher thermal resistance than that of the AlGaAs series materials, it is difficult to generate a laser oscillation and even if a laser oscillation is generated, the temperature characteristic is very poor. In order to confine the current, a structure is generally employed in which only the active region (light emitting region) is left in a column shape by etching and the side surface of the active region is buried by an AlGaInP system material having a high resistance or by a pn junction. In this case, regrowth on AlGaInP containing Al which is easily oxidized is difficult. In addition, when an AlGaInP system material is regrown on a substrate having a step, there arises a problem such that an abnormal growth is induced by a remarkable difference in growth speed depending on the surface orientation.

SUMMARY OF THE INVENTION

An object of the present invention is to provide an AlGaInP visible light surface emitting laser having an improved laser characteristic.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a visible light surface emitting laser device comprises a GaAs substrate having a (100) oriented main surface; a double heterojunction structure including at least an AlGaInP first cladding layer, an undoped GaInP active layer epitaxially grown on the first cladding layer under such conditions that a natural superlattice is formed, and an AlGaInP second cladding layer formed on the active layer and having an opposite conductivity type from that of the first cladding layer; a groove penetrating the substrate; and regions formed by diffusing impurities producing an opposite conductivity type from that of the second cladding layer, into regions other than a region opposite to the groove from the second cladding layer side so as not to reach the first cladding layer, disordering the natural superlattice. Thus, the GaInP active layer having natural a superlattice structure is between the AlGaInP system cladding layers, and regions in which the natural superlattice is disordered by impurity diffusion are formed in the active layer to provide an effective refractive index difference. Therefore, a current confinement structure and a light confinement structure is provided in the active layer, resulting in a visible light surface emitting laser that oscillates at a low threshold current and that controls transverse mode oscillation.

According to a second aspect of the present invention, a visible light surface emitting laser device comprises an n type GaAs substrate having (100) oriented first main surface; an n type semiconductor layer formed on the first main surface of substrate; a double heterojunction structure formed on the n type semiconductor layer and including a p type AlGaInP first cladding layer, an undoped GaInP active layer epitaxially grown on the p type cladding layer under such conditions that a natural superlattice is formed, and an n type AlGaInP cladding layer formed on the active layer; a groove penetrating the substrate; regions formed by diffusing first impurities producing p type conductivity into regions other than a region opposite to the groove from the n type AlGaInP cladding layer side so as not to reach the p type cladding layer, disordering the natural superlattice; and a p type region formed by diffusing second impurities producing p type conductivity from a second main surface of the substrate such that the diffusion front beneath the groove penetrates the n type semiconductor layer and reaches into the p type cladding layer. Thus, Zn is diffused into a part of the n type semiconductor layer to form a p type current path selectively, whereby current confinement to the active layer is performed effectively. As a result, a surface emitting laser device oscillating at a still lower threshold current and producing visible light is realized.

According to a third aspect of the present invention, AlGaAs having lower thermal resistance than that of AlGaInP is used for a part of the cladding layer. Therefore, a visible light surface emitting laser device oscillating at still lower threshold current and having a superior temperature characteristic is realized.

DETAILED DESCRIPTION OF THE PREFERRED EMBODIMENTS

Embodiments of the present invention will be described in detail with reference to the drawings.

Figure 1:
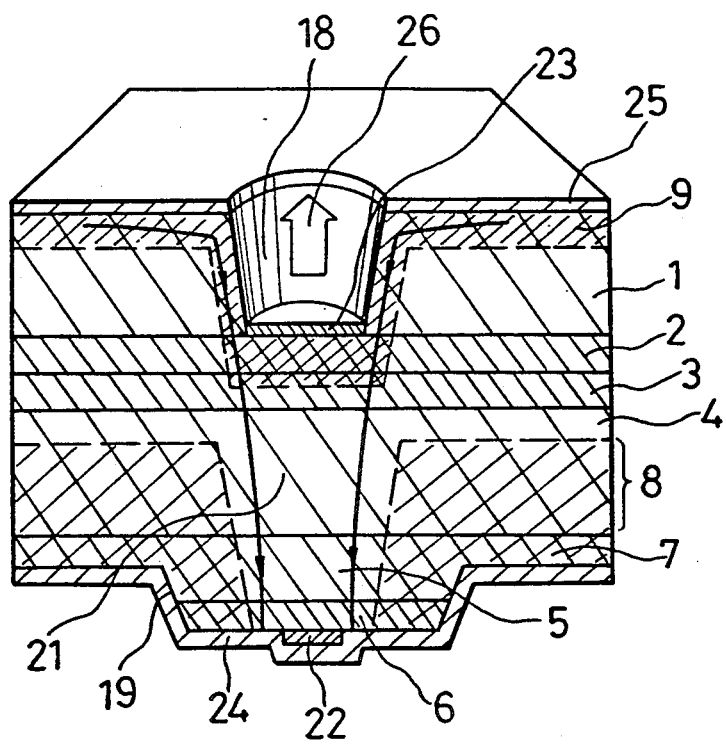
FIG. 1 is a cross-sectional view showing a visible light surface emitting laser device in accordance with a first embodiment of the present invention.

FIG. 1 is a cross-sectional view showing the structure of a visible light surface emitting laser device in accordance with a first embodiment of the present invention. In FIG. 1, reference numeral 1 designates a (100) oriented n type GaAs substrate. A first n type AlGaInP cladding layer 2 is disposed on a first main surface of the substrate 1. A p type AlGaInP cladding layer 3 is disposed beneath the first n type AlGaInP cladding layer 2. An undoped GaInP active layer 4 is disposed beneath the p type AlGaInP cladding layer 3. A second n type AlGaInP cladding layer 5 is disposed beneath the active layer 4. A groove 18 penetrates the substrate 1. The second n type cladding layer 5 has a circular mesa projection 19 at a region opposite to the groove 18. An n type GaAs layer 6 is disposed beneath the circular mesa projection 19 of the second n type cladding layer 5. A high reflectivity film 22 is disposed on the top surface of the circular mesa projection 19. An n side electrode 24 is disposed beneath the second n type cladding layer 5 covering the mesa projection 19 having the high reflectivity film 22. A p side electrode 25 is disposed on the other main surface, i.e., the second main surface of the substrate 1. An emitting surface reflecting film 23 is disposed on the bottom of the mesa groove 18. In addition, reference numerals 7 and 9 designate Zn diffused regions and numeral 8 designates a region in which the natural superlattice is disordered by the diffusion of Zn. Reference numeral 21 designates a light emitting region and numeral 26 designates emitted laser light.

FIGS. 2(a) to 2(f) are cross-sectional views of process steps for fabricating the visible light surface emitting laser device of FIG. 1. In these figures, the same reference numerals as those shown in FIG. 1 designate the same or corresponding parts.

Figure 2A:
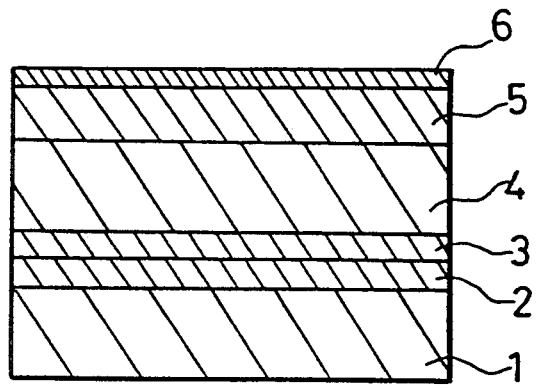
FIGS. 2(a) to 2(f) are cross-sectional views of process steps for fabricating the laser device of FIG. 1.

As shown in FIG. 2(a), A first n type $(Al_{0.7}Ga_{0.3})_{0.5}In_{0.5}P$ cladding layer 2 of 0.8 micron thickness, a p type $(Al_{0.7}Ga_{0.3})_{0.5}In_{0.5}P$ cladding layer 3 of 0.2 micron thickness, an undoped $Ga_{0.5}In_{0.5}P$ active layer 4 of 2 to 3 microns thickness, a second n type $(Al_{0.7}Ga_{0.3})_{0.5}In_{0.5}P$ cladding layer 5 of 1 micron thickness and an n type GaAs contact layer 6 of 0.5 micron thickness are successively grown on the (100) oriented n type GaAs substrate 1 by, for example, MOCVD (Metal Organic Chemical Vapor Deposition). Here, it is necessary to epitaxially grow the GaInP active layer 4 under such conditions that a natural superlattice will be formed therein and the energy band gap thereof will be equivalent to about 670 to 680 nm when it is converted into wavelength, by a reason described later. The growth is carried out at substrate temperature of 725° C. and V/III ratio of 500.

Figure 2B:
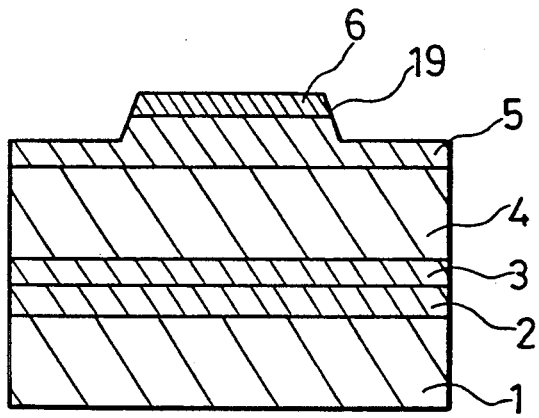
Figure 2C:
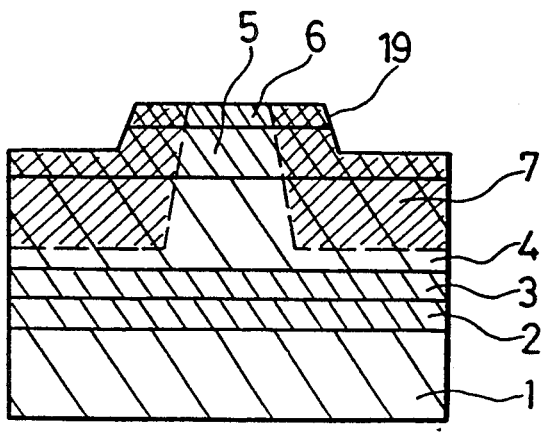

Then, as shown in FIG. 2(b), a mesa projection 19 is formed using ordinary photolithography and etching techniques. Then, Zn diffused from the wafer surface using a solid phase or vapor phase diffusion method so as to form a non-diffused region having a cylindrical shape or a truncated conical shape at the center of the element, whereby a Zn diffused region 7 not reaching the p type cladding layer 3 is formed as shown in FIG. 2(c). The diameter of the Zn non-diffused region at the top part of the mesa projection 19 is about 20 microns.

Figure 2D:
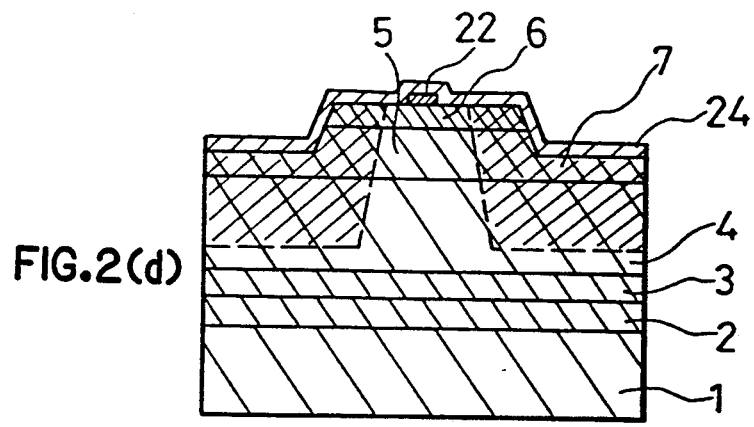

Thereafter, as shown in FIG. 2(d), a circular high reflectivity film 22 having a diameter of about 10 microns is formed on the center of the Zn non-diffused region at the top surface of the mesa projection 19 and, further, an n side electrode 24 is formed on the entire surface of the wafer.

Figure 2E:
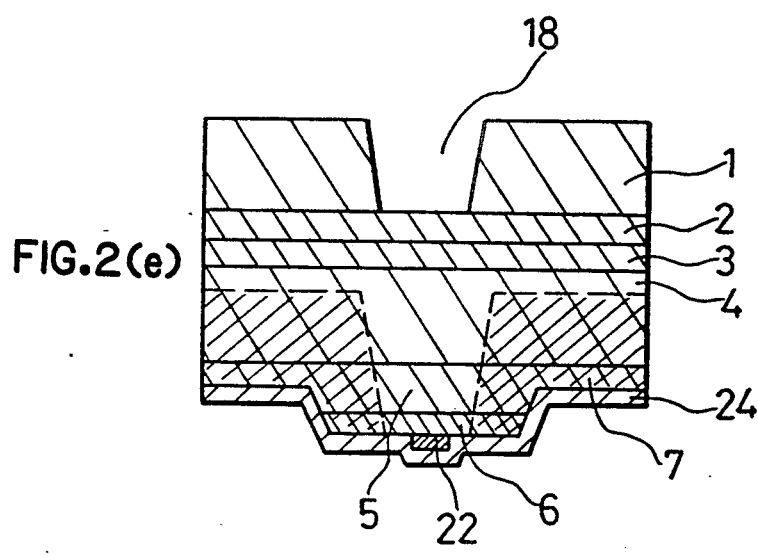

Then, as shown in FIG. 2(e), a groove 18 having a generally circular cross-section and penetrating the substrate 1 is formed from the other main surface, i.e., second main surface of the substrate 1. This groove 18 is opposite to the mesa projection 19 and the diameter of its bottom surface is about 20 microns.

Figure 2F:
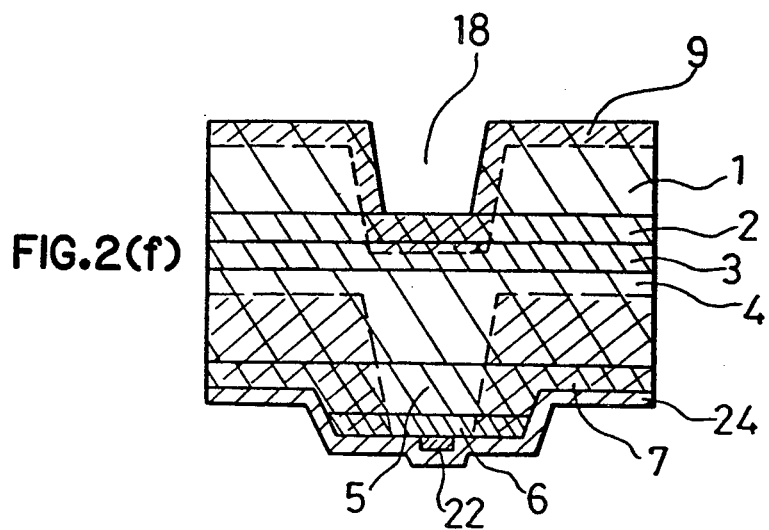

Thereafter, Zn diffusion is performed from the second main surface of the substrate 1 to form a Zn diffused region 9 whose diffusion front beneath the groove 18 reaches into the p type cladding layer 3, as shown in FIG. 2(f). Then, a high reflectivity film 23 comprising multilayer dielectric films is formed on the bottom surface of the groove 18 and a p side electrode 25 is formed on the second main surface of the substrate 1, completing the surface emitting laser device of FIG. 1.

This laser device operates as follows.

In this first embodiment of the present invention, Zn diffused region 9 is formed in the surface region of the n type GaAs substrate 1 at the electrode side, on the side surface of the groove 18, and penetrates the n type AlGaInP cladding layer 2 reaching into the p type AlGaInP cladding layer 3. On the other hand, regions 8 in which the natural superlattice is disordered are formed in the active layer 4 by the Zn diffusion performed from the n type GaAs layer 6 side. Accordingly, when a forward direction bias is applied between the p side electrode 23 and the n side electrode 24, current is efficiently injected into a region in the active layer 4 opposite the groove 18 as shown by the arrow in FIG. 1, whereby light emission and recombination of carriers occur in that region. The generated light is reflected and amplified between the emitting surface reflecting film 23 formed on the bottom of the groove 18 and the high reflectivity film 22 formed on the top surface of the mesa projection 19, resulting in laser oscillation. Thus, the laser light 26 is emitted from the groove 18. In the regions 8 in the GaInP active layer 4, the natural superlattice in GaInP is disordered by the diffusion of Zn and the energy band gap is increased. The energy band gap corresponds to about 650 nm when it is converted into wavelength. As described above, the energy band gap of the undoped GaInP active layer 4 is equivalent to about 670 to 680 nm when it is converted into wavelength and there is a difference in energy band gaps between the non-diffused region and the regions 8 in which the natural superlattice is disordered by the Zn diffusion. That is, the refractive index drops in the Zn diffused regions 8. Therefore, light generated in the Zn non-diffused region in the active layer 4 is confined in this region, whereby the transverse mode oscillation can be stabilized. As described above, in the laser structure of the first embodiment of the present invention, current is efficiently injected into the active layer 4 from the Zn diffused region 9 and the transverse mode oscillation of the light generated in the light emitting region 21 is stably controlled by the difference in refractive indices between the Zn diffused region 8 and the light emitting region 21.

The current confined by the Zn diffused region 9 spreads in a transverse direction in the p type AlGaInP cladding layer 3, so that the current confinement effect is lowered a little in the p type AlGaInP cladding layer 3. In the first embodiment of the present invention, the cladding layer 3 is about 0.2 micron, whereby the lowering of the current confinement effect is reduced. In order to reduce the lowering of the current confinement effect, the thinner the cladding layer 3 the better. However, since the diffusion front of the Zn diffused region 9 beneath the groove 18 is required to be present in the cladding layer 3, if the cladding layer 3 is too thin, it is difficult to control the diffusion front.

The cross-section of the light emitting region 21, i.e., the Zn non-diffused region in the active layer, perpendicular to the layer thickness direction is not restricted to a circular shape and may be square. When the cross-section is circular like the first embodiment of the present invention, the configuration of the emitted beam is also circular, so that this emitted beam can be easily treated.

Figure 3:
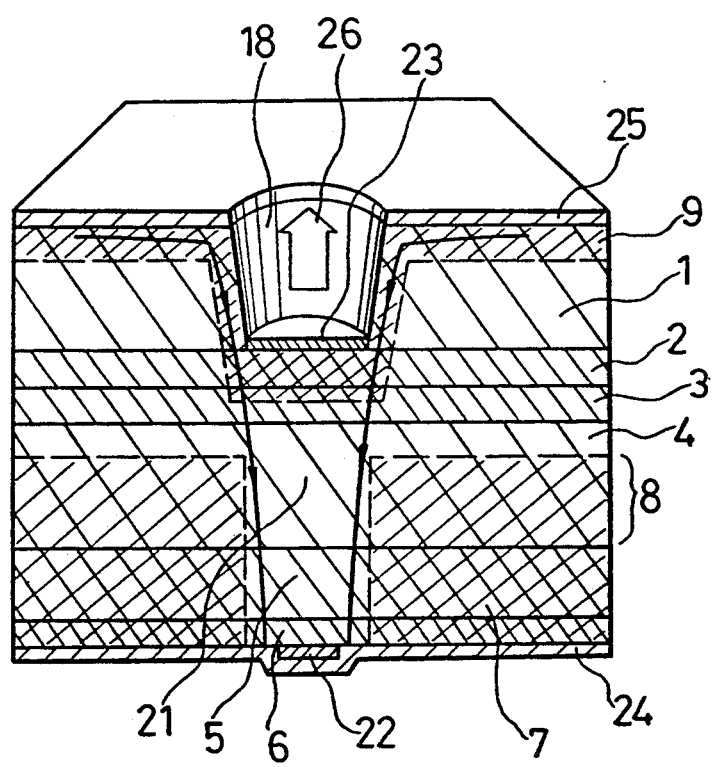
FIG. 3 is a cross-sectional view showing a visible light surface emitting laser device in accordance with a second embodiment of the present invention.

A description is given of a second embodiment of the present invention. FIG. 3 is a cross-sectional view showing a visible light surface emitting laser device in accordance with the second embodiment of the present invention, which is obtained by simplifying the structure of the first embodiment shown in FIG. 1. In this second embodiment, Zn diffusion is performed without forming the mesa projection 19 in FIG. 1.

The production process is the same as that of the first embodiment except for that the mesa 19 is not formed in this second embodiment. When a deeper diffusion is carried out, control of the diffusion front becomes more difficult. Therefore, in this second embodiment, it is difficult to control the Zn diffusion performed from the n type GaAs layer 6 side. However, since an etching process is omitted, the production process is simplified.

The principle of operation and the effect of this second embodiment are the same as those of the first embodiment. More specifically, current is efficiently injected into the active layer 4 from the Zn diffused region 9 as shown by the arrow in FIG. 3 and transverse mode oscillation in the light emitting region 21 can be stably controlled by the difference in the refraction indices between the Zn diffused region 8 and the light emitting region 21.

Figure 4:
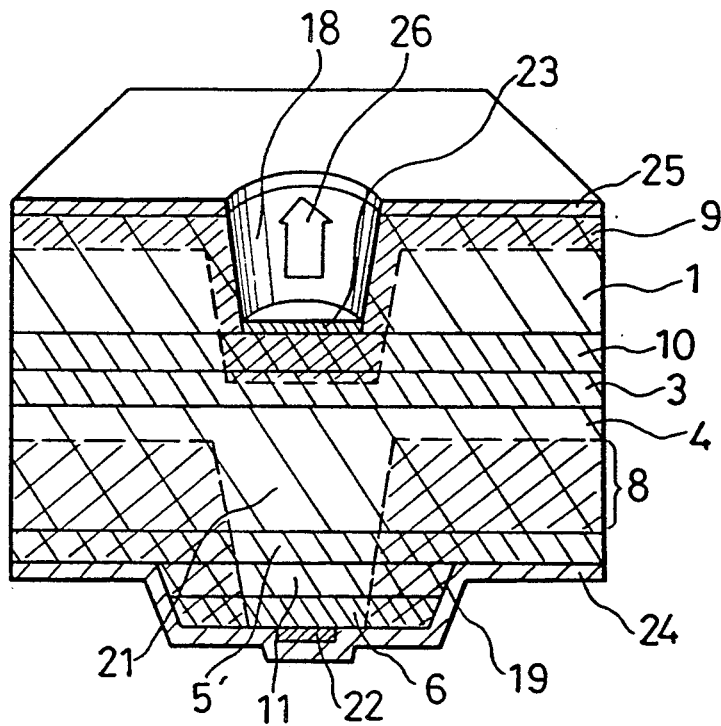
FIG. 4 is a cross-sectional view showing a visible light surface emitting laser device in accordance with a third embodiment of the present invention.

Description is given of a third embodiment of the present invention. FIG. 4 is a cross-sectional view showing a visible light surface emitting laser device in accordance with the third embodiment of the present invention. In FIG. 4, reference numeral 10 designates an n type $Al_xGa_{1-x}As$ ($0.7<x<0.9$) cladding layer and numeral 11 designates a second n type $Al_xGa_{1-x}As$ ($0.7<x<0.9$) cladding layer.

In this third embodiment, the temperature characteristics of the laser device compared to the first and second embodiments are improved. Generally, AlGaInP has high thermal resistance and this causes deterioration in the temperature characteristics of a laser device. In this third embodiment, AlGaAs which has a lower thermal resistance than AlGaInP is used for a part of the cladding layer and AlGaInP/AlGaAs double cladding layer structure is employed.

Figure 6A:
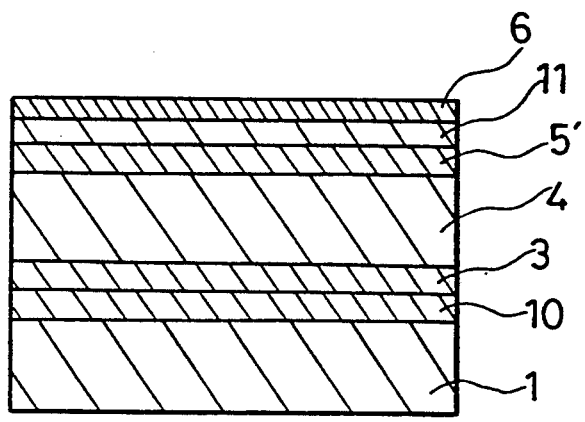
FIGS. 6(a) and 6(b) are cross-sectional views of process steps for fabricating the laser device of FIG. 4.
Figure 6B:
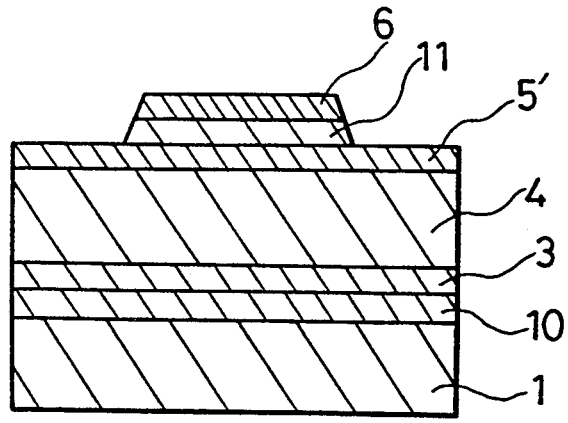
Figure 7:
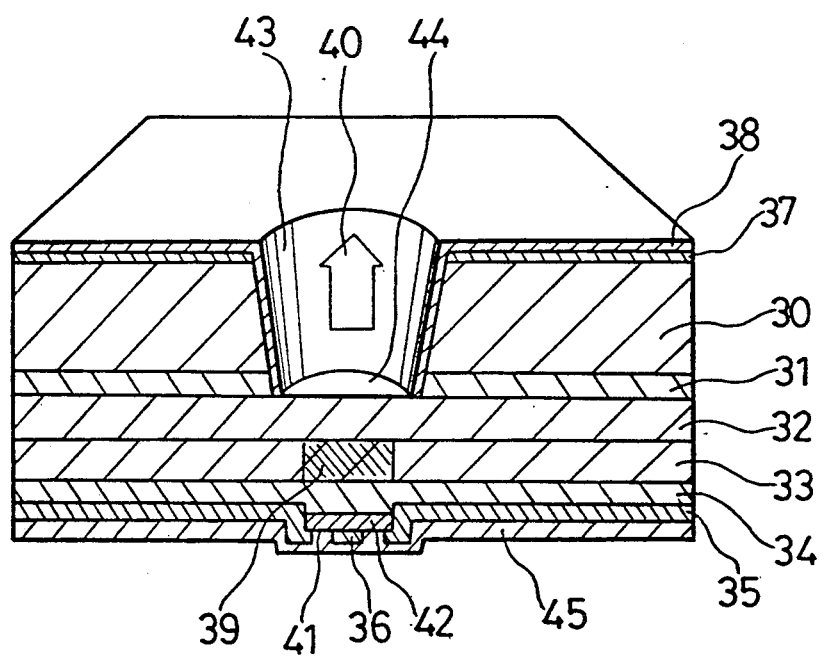
FIG. 7 is a cross-sectional view showing a surface emitting laser device in accordance with the prior art.

FIGS. 6(a) and 6(b) are cross-sectional views of process steps for fabricating the laser device of FIG. 4.

As shown in FIG. 6(a), a first n type $Al_xGa_{1-x}As$ ($0.7<x<0.9$) cladding layer 10 of 0.8 micron thickness, a p type $(Al_{0.7}Ga_{0.3})_{0.5}In_{0.5}P$ cladding layer 3 of 0.2 micron thickness, an undoped $Ga_{0.5}In_{0.5}P$ active layer 4 of 2 to 3 microns thickness, an n type $(Al_{0.7}Ga_{0.3})_{0.5}In_{0.5}P$ cladding layer 5' of 0.2 micron thickness, a second n type $Al_xGa_{1-x}As$ ($0.7<x<0.9$) cladding layer 11 of 0.8 micron thickness and an n type GaAs contact layer 6 of 0.5 micron thickness are successively grown on the (100) oriented n type GaAs substrate 1 by, for example, MOCVD. The GaInP active layer 4 is epitaxially grown under conditions such that a natural superlattice is formed and the energy band gap is about 670 to 680 nm when it is converted into wavelength, similarly as in the first embodiment. The growth is carried out at the substrate temperature of 725° C. and the V/III ratio of 500. Then, as shown in FIG. 6(b), a mesa projection 19 is formed using ordinary photolithography and etching techniques. Here, if a selective etching is performed using an etchant having different etching rates for AlGaAs and for AlGaInP, the n type $(Al_{0.7}Ga_{0.3})_{0.5}In_{0.5}P$ cladding layer 5' can be used as an etch-stop layer, whereby the mesa projection 19 can be formed with high controllability.

The process steps after the formation of the mesa projection 19 are the same as FIGS. 2(c) to 2(f).

This laser device will operate as follows.

The fundamental laser oscillating operation is the same as those of the first and second embodiments. Since AlGaAs has a lower thermal resistance than AlGaInP, the heat generated by the laser operation is not confined in the element but effectively radiated to a heat sink which is disposed adjacent to the upper part or the lower part of the laser device in practical use. As a result, deterioration in laser characteristics caused by the heat generated during the laser operation is reduced.

Figure 5:
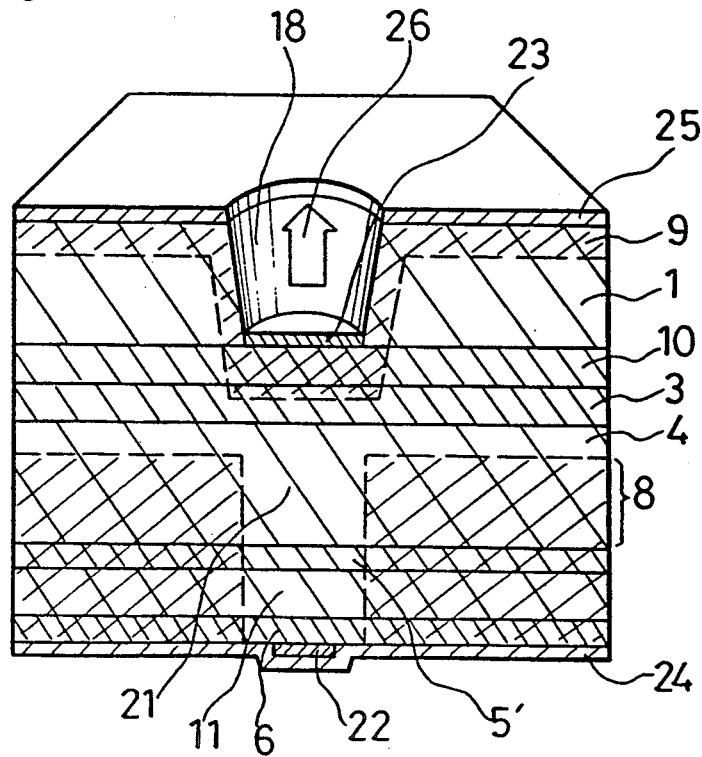
FIG. 5 is a cross-sectional view showing a visible light surface emitting laser device in accordance with a fourth embodiment of the present invention.

FIG. 5 is a cross-sectional view showing a visible light surface emitting laser device in accordance with a fourth embodiment of the present invention. In this fourth embodiment, Zn diffusion is performed without forming the mesa projection 19 of the third embodiment. Also in this case, the same effects as described above can be obtained.

As is evident from the foregoing description, in accordance with a first aspect of the present invention, an active layer having natural superlattice structure is put between AlGaInP cladding layers and an effective refraction index difference is provided in the active layer by impurity diffusion. Therefore, a current confinement structure and a light confinement structure can be realized in the active layer. As a result, a visible light surface emitting laser device that oscillates at low threshold current and that controls transverse mode oscillation is realized.

In accordance with a second aspect of the present invention, Zn is diffused into a part of n type semiconductor layer to form a p type current path selectively, whereby current confinement in the active layer can be performed effectively. As a result, a visible light surface emitting laser device which oscillates at still lower threshold current is realized.

In accordance with a third aspect of the present invention, an AlGaInP/AlGaAs double cladding layer structure is employed using AlGaAs which has a lower thermal resistance than AlGaInP. Therefore, an AlGaInP system visible light surface emitting layer device having an improved temperature characteristic is realized.

What is claimed is:

1. A surface emitting laser device for emitting visible light in a direction perpendicular to a main substrate surface comprising:
   an n type GaAs substrate having a (100) oriented first main surface;
   an n type semiconductor layer disposed on said first main surface of said substrate;
   a double heterojunction structure disposed on said n type semiconductor layer including a p type AlGaInP first cladding layer, an undoped GaInP active layer epitaxially grown on said p type cladding layer under conditions such that a natural superlattice is formed, and an n type AlGaInP cladding layer disposed on said active layer;
   a groove penetrating said substrate to said n type semiconductor layer;
   a first p type region formed by diffusing a dopant impurity, said first p type region being disposed in said n type AlGaInP cladding and active layers other than opposite the groove and not reaching said p type cladding layer, said natural superlattice being disordered in said first region;
   a second p type region formed by diffusing a dopant impurity, said second p type region being disposed in said substrate, said n type semiconductor layer, and said p type AlGaInP cladding layer, and penetrating through said n type semiconductor layer and reaching into said p type cladding layer opposite the groove; and
   first and second electrodes disposed on said substrate and said n type AlGaInP cladding layer, respectively.

2. A laser device in accordance with claim 1 wherein said n type semiconductor layer comprises AlGaAs.

3. A laser device in accordance with claim 1 comprising:
   an n type GaAs contact layer disposed on said n type AlGaInP cladding layer
   wherein at least part of said second electrode is disposed on said n type GaAs contact layer.

4. A laser device in accordance with claim 2 comprising:
   an n type GaAs contact layer disposed on said n type AlGaInP cladding layer
   wherein at least part of said second electrode is disposed on said n type GaAs contact layer.

5. A laser device in accordance with claim 1 wherein said p type impurity is Zn.

6. A laser device in accordance with claim 3 including an n type AlGaAs layer disposed between said n type AlGaInP cladding layer and said n type GaAs contact layer.

7. A surface emitting laser device for emitting visible light in a direction perpendicular to a main substrate surface comprising:
   a first conductivity type GaAs substrate having a (100) oriented first main surface;
   a first conductivity type semiconductor layer disposed on said first main surface of said substrate;
   a double heterojunction structure disposed on said first conductivity type semiconductor layer including a second conductivity type, opposite the first conductivity type, AlGaInP first cladding layer, an undoped GaInP active layer epitaxially grown on said second conductivity type cladding layer under conditions such that a natural superlattice is formed, and a first conductivity type AlGaInP cladding layer disposed on said active layer;
   a groove penetrating said substrate to said first conductivity type semiconductor layer;
   a first second conductivity type region formed by diffusing a dopant impurity, said first second conductivity type region being disposed in said first conductivity type AlGaInP cladding and active layers other than opposite the groove and not reaching said second conductivity type cladding layer, said natural superlattice being disordered in said first region;
   a second conductivity type region formed by diffusing a dopant impurity, said second conductivity type region being disposed in said substrate, said first conductivity type semiconductor layer, and said second conductivity type AlGaInP cladding layer, and penetrating through said first conductivity type semiconductor layer and reaching into said second conductivity type cladding layer opposite the groove; and
   first and second electrodes disposed on said substrate and said first conductivity type AlGaInP cladding layer, respectively.

8. A laser device in accordance with claim 7 wherein said first conductivity type semiconductor layer comprises AlGaAs.

9. A laser device in accordance with claim 8 comprising a first conductivity type GaAs contact layer disposed on said first conductivity type AlGaInP cladding layer wherein at least part of said second electrode is disposed on said first conductivity type GaAs contact layer.

10. A laser device in accordance with claim 9 including an first conductivity type AlGaAs layer disposed between said first conductivity type AlGaInP cladding layer and said first conductivity type GaAs contact layer.

11. A surface emitting laser device for emitting visible light in a direction perpendicular to a main substrate surface comprising:
- a first conductivity type GaAs substrate having a (100) oriented first main surface;
- a first conductivity type semiconductor layer disposed on said first main surface of said substrate;
- a double heterojunction structure disposed on said first conductivity type semiconductor layer including a second conductivity type, opposite the first conductivity type, AlGaInP first cladding layer, an undoped GaInP active layer epitaxially grown on said second conductivity type cladding layer under conditions such that a natural superlattice is formed, and a first conductivity type AlGaInP cladding layer disposed on said active layer;
- a groove penetrating said substrate to said first conductivity type semiconductor layer;
- a first second conductivity type region formed by diffusing a dopant impurity, said second conductivity type region being disposed in said substrate, said first conductivity type semiconductor layer, and said second conductivity type AlGaInP cladding layer, and penetrating through said first conductivity type semiconductor layer and reaching into said second conductivity type cladding layer opposite the groove; and
- first and second electrodes disposed on said substrate and said first conductivity type AlGaInP cladding layer, respectively.

12. A laser device in accordance with claim 11 wherein said first conductivity type semiconductor layer comprises AlGaAs.

13. A laser device in accordance with claim 11 comprising a first conductivity type GaAs contact layer disposed on said first conductivity type AlGaInP cladding layer wherein at least part of said second electrode is disposed on said first conductivity type GaAs contact layer.

14. A laser device in accordance with claim 13 including an first conductivity type AlGaAs layer disposed between said first conductivity type AlGaInP cladding layer and said first conductivity type GaAs contact layer.

15. A laser device in accordance with claim 11 wherein said second conductivity type is p-type and said impurity is zinc.

* * * * *